US012598861B2

(12) United States Patent
Wang

(10) Patent No.: US 12,598,861 B2
(45) Date of Patent: Apr. 7, 2026

(54) DISPLAY PANELS

(71) Applicant: Wuhan China Star Optoelectronics Semiconductor Display Technology Co., Ltd., Wuhan (CN)

(72) Inventor: Haoran Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 385 days.

(21) Appl. No.: 18/283,012

(22) PCT Filed: Jul. 18, 2023

(86) PCT No.: PCT/CN2023/107851
§ 371 (c)(1),
(2) Date: Sep. 20, 2023

(87) PCT Pub. No.: WO2025/000601
PCT Pub. Date: Jan. 2, 2025

(65) Prior Publication Data
US 2025/0040338 A1      Jan. 30, 2025

(30) Foreign Application Priority Data
Jun. 30, 2023    (CN) ........................ 202310803063.X

(51) Int. Cl.
*H10K 50/15*      (2023.01)
*H10K 101/40*     (2023.01)
*H10K 102/00*     (2023.01)

(52) U.S. Cl.
CPC ....... *H10K 50/156* (2023.02); *H10K 2101/40* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 2019/0326535 A1* | 10/2019 | Kim | ..................... H10K 50/125 |
| 2019/0386234 A1 | 12/2019 | Cheng et al. | |
| 2022/0384754 A1 | 12/2022 | Mizusaki | |

FOREIGN PATENT DOCUMENTS

| | | |
|---|---|---|
| CN | 110364636 | 10/2019 |
| CN | 113437231 | 9/2021 |
| CN | 113594379 | 11/2021 |

OTHER PUBLICATIONS

International Search Report and the Written Opinion Dated Jan. 3, 2024 From the International Searching Authority Re. Application No. PCT/CN2023/107851 and Its Translation Into English. (13 Pages).

* cited by examiner

*Primary Examiner* — Jack S Chen

(57) ABSTRACT

Embodiments of the present disclosure provide a display panel, in which a hole control layer is disposed on a hole transport layer, a light-emitting material layer is disposed on the hole control layer, and the hole control layer includes a first sub-hole control layer and a second sub-hole control layer. An energy difference between a HOMO energy level of the first sub-hole control layer and a HOMO energy level of the second sub-hole control layer is greater than or equal to 0.2 eV, and the HOMO energy level of the second sub-hole control layer is greater than a HOMO energy level of the light-emitting material layer and less than a HOMO energy level of the hole transport layer.

20 Claims, 3 Drawing Sheets

DISPLAY PANELS

RELATED APPLICATIONS

This application is a National Phase of PCT Patent Application No. PCT/CN2023/107851 having International filing date of Jul. 18, 2023, which claims the benefit of priority of China Patent Application No. 202310803063.X filed on Jun. 30, 2023. The contents of the above applications are all incorporated by reference as if fully set forth herein in their entirety.

TECHNICAL FIELD

The disclosure relates to the field of display technology, in particular to display panels.

BACKGROUND

Organic light-emitting diode (OLED) display panels have been widely used in daily life, such as display screens for a mobile phone, a computer, a car, and the like. The organic light-emitting display panel includes multiple light-emitting devices that can emit light to display images. A red light-emitting device, a green light-emitting device, and a blue light-emitting device in the organic light-emitting display panel independently has the advantage of self-illumination, which can provide color images with high contrast ratio.

However, if there is a significant difference in turn-on voltages (Vth) of the red light-emitting device, the green light-emitting device, and the blue light-emitting device, it will cause problems of light penetration or light leakage of the light-emitting device with a certain color under a black screen. For example, if the turn-on voltage of the green light-emitting device is greater than the turn-on voltage of the red light-emitting device, the red light-emitting device is also brightened when only the green light-emitting device wants to be lit.

SUMMARY

Embodiments of the present disclosure provide a display panel that can solve a problem of light penetration or light leakage of a light-emitting device with a certain color under a black screen.

Embodiments of the present disclosure provide a display panel, including:

a first electrode;

a hole transport layer disposed on the first electrode;

a hole control layer disposed on the hole transport layer;

a light-emitting material layer disposed on the hole control layer; and a second electrode disposed on the light-emitting material layer;

in which the hole control layer includes a first sub-hole control layer and a second sub-hole control layer, a thickness of the first sub-hole control layer is less than a thickness of the second sub-hole control layer, and an energy difference between a HOMO energy level of the first sub-hole control layer and a HOMO energy level of the second sub-hole control layer is greater than or equal to 0.2 eV, and the HOMO energy level of the second sub-hole control layer is greater than a HOMO energy level of the light-emitting material layer and less than a HOMO energy level of the hole transport layer.

Optionally, in some embodiments, a hole mobility of the first sub-hole control layer may be less than a hole mobility of the second sub-hole control layer.

Optionally, in some embodiments, a ratio of the hole mobility of the first sub-hole control layer to the hole mobility of the second sub-hole control layer may be less than or equal to 0.8.

Optionally, in some embodiments, the first sub-hole control layer may be disposed between the hole transport layer and the second sub-hole control layer.

Optionally, in some embodiments, the HOMO energy level of the first sub-hole control layer may be greater than the HOMO energy level of the light-emitting material layer and less than the HOMO energy level of the second sub-hole control layer; and a LUMO energy level of the first sub-hole control layer may be greater than a LUMO energy level of the light-emitting material layer, and less than a LUMO energy level of the second sub-hole control layer and a LUMO energy level of the hole transport layer.

Optionally, in some embodiments, the HOMO energy level of the first sub-hole control layer may be greater than the HOMO energy level of the hole transport layer; and a LUMO energy level of the first sub-hole control layer may be greater than a LUMO energy level of the light-emitting material layer, a LUMO energy level of the second sub-hole control layer, and a LUMO energy level of the hole transport layer.

Optionally, in some embodiments, the first sub-hole control layer may be disposed between the second sub-hole control layer and the light-emitting material layer.

Optionally, in some embodiments, the HOMO energy level of the first sub-hole control layer may be greater than the HOMO energy level of the second sub-hole control layer and less than the HOMO energy level of the hole transport layer; and a LUMO energy level of the first sub-hole control layer may be greater than a LUMO energy level of the light-emitting material layer and less than a LUMO energy level of the hole transport layer.

Optionally, in some embodiments, the HOMO energy level of the first sub-hole control layer may be less than the HOMO energy level of the light-emitting material layer; and a LUMO energy level of the first sub-hole control layer may be greater than a LUMO energy level of the light-emitting material layer and less than a LUMO energy level of the hole transport layer.

Optionally, in some embodiments, the LUMO energy level of the first sub-hole control layer may be equal to a LUMO energy level of the second sub-hole control layer.

Optionally, in some embodiments, the thickness of the first sub-hole control layer may range from 3 nanometers to 10 nanometers.

Optionally, in some embodiments, a LUMO energy level of the second sub-hole control layer may be greater than a LUMO energy level of the light-emitting material layer and less than a LUMO energy level of the hole transport layer; and an energy difference between the LUMO energy level of the second sub-hole control layer and the LUMO energy level of the light-emitting material layer may be greater than or equal to 0.2 eV.

Beneficial Effects

The present disclosure provides a display panel including a first electrode, a hole transport layer disposed on the first electrode, a hole control layer disposed on the hole transport layer, a light-emitting material layer disposed on the hole control layer, and a second electrode disposed on the light-emitting material layer. The hole control layer includes a first sub-hole control layer and a second sub-hole control layer. A thickness of the first sub-hole control layer is less than a thickness of the second sub-hole control layer. An energy difference between a HOMO energy level of the first sub-hole control layer and a HOMO energy level of the second sub-hole control layer is greater than or equal to 0.2 eV, and the HOMO energy level of the second sub-hole control layer is greater than a HOMO energy level of the light-emitting material layer and less than a HOMO energy level of the hole transport layer. In the present disclosure, the hole control layer is added in a light-emitting device or the display panel, and the hole control layer includes the first sub-hole control layer and the second sub-hole control layer. Because the energy difference between the HOMO energy level of the first sub-hole control layer and the HOMO energy level of the second sub-hole control layer is greater than or equal to 0.2 eV, and the HOMO energy level of the second sub-hole control layer is greater than the HOMO energy level of the light-emitting material layer and less than the HOMO energy level of the hole transport layer, a potential barrier difference can be formed between the second sub-hole control layer and the hole transport layer, or between the second sub-hole control layer and the light-emitting material layer, which can form a deep HOMO energy trap and increase a hole injection potential barrier, thereby increasing an turn-on voltage of the light-emitting device. Therefore, even if there is a small amount of leakaging current or leakaging voltage between adjacent light-emitting devices, it will not cause the original light-emitting device in a dark state to emit light, and thus, the problem of light penetration or light leakage of the light-emitting device with a certain color under a black screen can be solved.

DESCRIPTION OF DRAWINGS

In order to explain technical solutions in the embodiments of the present disclosure more clearly, the following will briefly introduce the drawings needed to be used in description of the embodiments. Apparently, the drawings in the following description are only some embodiments of the present disclosure. For those skilled in the art, other drawings can be obtained from these drawings without paying creative effort.

DETAILED DESCRIPTION OF EMBODIMENTS

Figure 1:
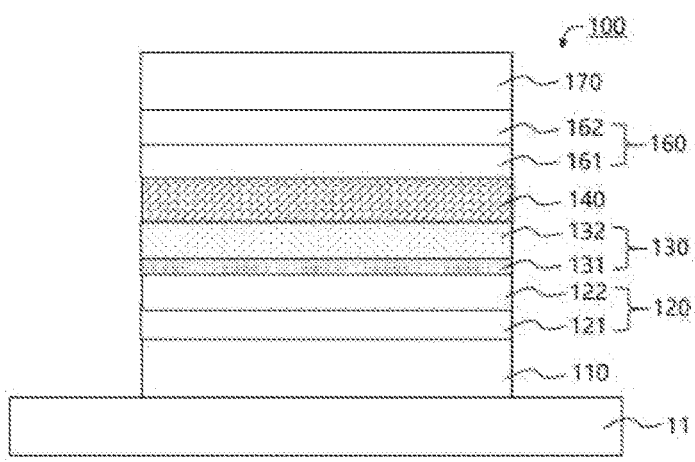
FIG. 1 is a schematic cross-sectional diagram of a first light-emitting device according to some embodiments of the present disclosure.

The following will provide a clear and complete description of the technical solutions in the embodiments of the present disclosure in conjunction with the accompanying drawings. Apparently, the described embodiments are only a part of the embodiments of the present disclosure, not all of them. Based on the embodiments of the present disclosure, all other embodiments obtained by those skilled in the art without creative effort fall within the protection scope of the present disclosure. In addition, it should be understood that specific embodiments described herein are only used for the purpose of demonstrating and explaining the present disclosure and are not intended to limit the present disclosure. In the present disclosure, the directional terms used, such as "up" and "down", generally refer to up and down positions of the device in actual use or working state, specifically the surface directions in the drawings, unless otherwise specified, such as terms "inside" and "outside", are specific to the contour of the device.

Embodiments of the present disclosure provide a display panel, which includes a first electrode, a hole transport layer disposed on the first electrode, a hole control layer disposed on the hole transport layer, a light-emitting material layer disposed on the hole control layer, and a second electrode disposed on the light-emitting material layer. The hole control layer includes a first sub-hole control layer and a second sub-hole control layer. A thickness of the first sub-hole control layer is less than a thickness of the second sub-hole control layer. An energy difference between a highest occupied molecular orbital (HOMO) energy level of the first sub-hole control layer and a HOMO energy level of the second sub-hole control layer is greater than or equal to 0.2 eV, and the HOMO energy level of the second sub-hole control layer is greater than a HOMO energy level of the light-emitting material layer and less than a HOMO energy level of the hole transport layer.

Figure 2:
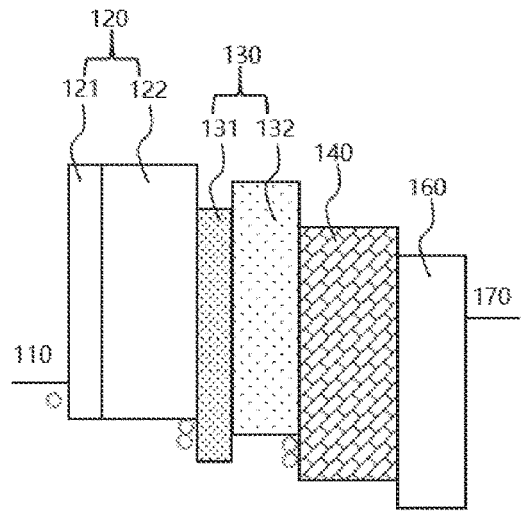
FIG. 2 is a schematic diagram of a HOMO energy level of a light-emitting device according to an embodiment 1 of the present disclosure.
Figure 3:
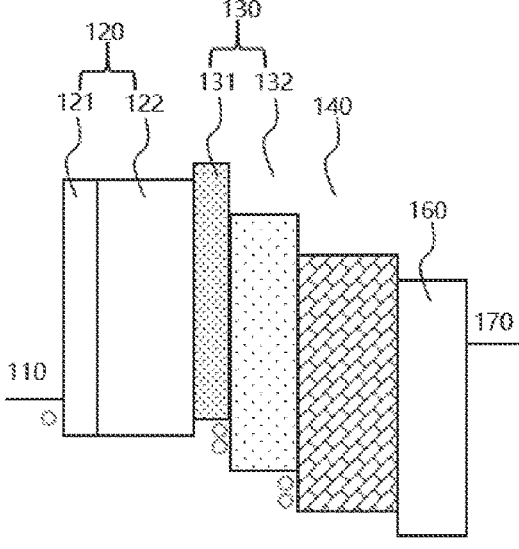
FIG. 3 is a schematic diagram of a HOMO energy level of a light-emitting device according to an embodiment 2 of the present disclosure.
Figure 4:
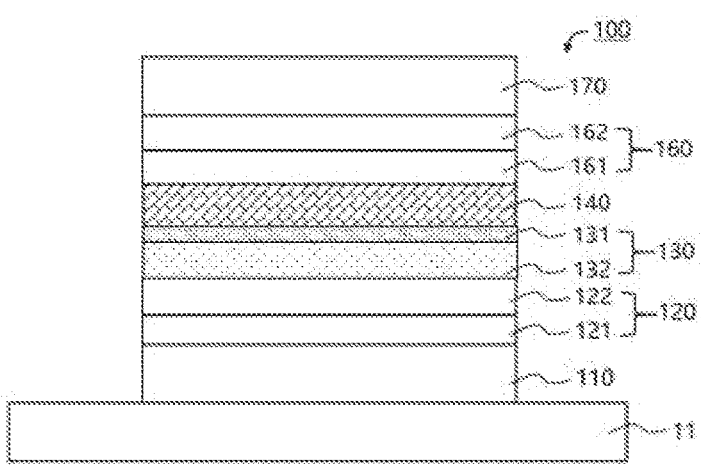
FIG. 4 is a schematic cross-sectional diagram of a second light-emitting device according to some embodiments of the present disclosure.
Figure 5:
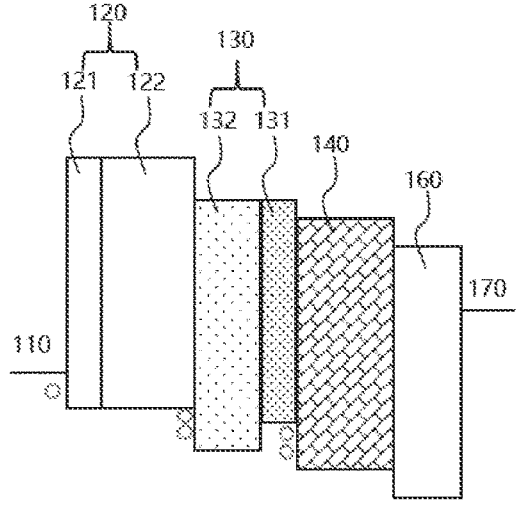
FIG. 5 is a schematic diagram of a HOMO energy level of a light-emitting device according to an embodiment 3 of the present disclosure.
Figure 6:
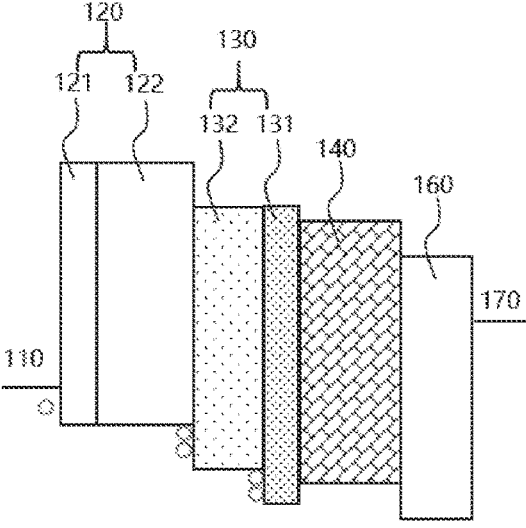
FIG. 6 is a schematic diagram of a HOMO energy level of a light-emitting device according to an embodiment 4 of the present disclosure.

Referring to FIGS. 1 to 6, FIG. 1 is a schematic cross-sectional diagram of a first light-emitting device according to some embodiments of the present disclosure, FIG. 2 is a schematic diagram of a HOMO energy level of a light-emitting device according to an embodiment 1 of the present disclosure, FIG. 3 is a schematic diagram of a HOMO energy level of a light-emitting device according to an embodiment 2 of the present disclosure, FIG. 4 is a schematic cross-sectional diagram of a second light-emitting device according to some embodiments of the present disclosure, FIG. 5 is a schematic diagram of a HOMO energy level of a light-emitting device according to an embodiment 3 of the present disclosure, and FIG. 6 is a schematic diagram of a HOMO energy level of a light-emitting device according to an embodiment 4 of the present disclosure. FIG. 2 and FIG. 3 are schematic diagrams of the HOMO energy level of the light-emitting device in FIG. 1, and FIG. 5 and FIG. 6 are schematic diagrams of the HOMO energy level of the light-emitting device in FIG. 4.

The present disclosure provides a display panel 100 that includes a first electrode 110, a hole transport layer 120, a hole control layer 130, a light-emitting material layer 140, and a second electrode 170. The hole transport layer 120 is disposed on the first electrode 110. The hole control layer 130 is disposed on the hole transport layer 120. The light-emitting material layer 140 is disposed on the hole control layer 130. The second electrode 170 is disposed on the light-emitting material layer 140. The hole control layer 130 includes a first sub-hole control layer 131 and a second sub-hole control layer 132. A thickness of the first sub-hole control layer 131 is less than a thickness of the second sub-hole control layer 132. An energy difference between a HOMO energy level of the first sub-hole control layer 131 and a HOMO energy level of the second sub-hole control layer 132 is greater than or equal to 0.2 eV. The HOMO energy level of the second sub-hole control layer 132 is greater than a HOMO energy level of the light-emitting material layer 140 and less than a HOMO energy level of the hole transport layer 120.

Specifically, the display panel 100 includes a light-emitting device, and the light-emitting device includes the first electrode 110, the hole transport layer 120, the hole control layer 130, the light-emitting material layer 140, and the second electrode 170.

Specifically, the display panel 100 includes a substrate 11, and the light-emitting device or the first electrode 110 can be disposed on the substrate 11.

Specifically, the first electrode 110 can be an anode, and the second electrode 170 can be a cathode; or, the first electrode 110 can be the cathode, and the second electrode 170 can be the anode. The first electrode 110 being the anode will be taken for an example for illustration in the following embodiments.

Specifically, the energy difference between the HOMO energy level of the first sub-hole control layer 131 and the HOMO energy level of the second sub-hole control layer 132 is greater than or equal to 0.2 eV, which means that an absolute value of the energy difference between the HOMO energy level of the first sub-hole control layer 131 and the HOMO energy level of the second sub-hole control layer 132 is greater than or equal to 0.2 eV.

Specifically, a potential barrier difference is formed between the hole transport layer 120 and the first sub-hole control layer 131 in FIG. 2, FIG. 5, and FIG. 6, a potential barrier difference is formed between the first sub-hole control layer 131 and the second sub-hole control layer 132 in FIG. 3 and FIG. 6, and a potential barrier difference is formed between the second sub-hole control layer 132 and the light-emitting material layer 140 in FIG. 2, FIG. 3, and FIG. 5, forming deep HOMO energy trap, which increases the hole injection potential barrier, so that a larger voltage is required to transport hole or positive charge carriers, thereby increasing an turn-on voltage of the light-emitting device or display panel. Therefore, even if there is a small amount of leakage current or leakage voltage between adjacent light-emitting devices, it will not cause the original light-emitting device in a dark state to emit light, thus, the problem of light penetration or light leakage of the light-emitting device with a certain color under a black screen can be solved.

In some embodiments, a hole mobility of the first sub-hole control layer 131 is less than a hole mobility of the second sub-hole control layer 132.

Specifically, the thickness of the first sub-hole control layer 131 is less than the thickness of the second sub-hole control layer 132, and the hole mobility of the first sub-hole control layer 131 is less than the hole mobility of the second sub-hole control layer 132. Compared to the first sub-hole control layer 131, the thickness of the second sub-hole control layer 132 is thicker, thus, the hole control layer 130 has higher mobility by maintaining the higher thickness and the higher mobility of the second sub-hole control layer 132, thereby maintaining an operation voltage of the light-emitting device without increasing.

In some embodiments, a ratio of the hole mobility of the first sub-hole control layer 131 to the hole mobility of the second sub-hole control layer 132 is less than or equal to 0.8.

Specifically, the ratio of the hole mobility of the first sub-hole control layer 131 to the hole mobility of the second sub-hole control layer 132 is less than or equal to 0.8, and the second sub-hole control layer 132 has the higher thickness and the higher mobility, making the hole control layer 130 have higher mobility, and further maintaining the operation voltage of the light-emitting device without increasing.

The following will provide detailed explanations according to different embodiments. It should be noted that the order of describing the following embodiments does not serve as a limitation on a preferred order of the embodiments.

Embodiment 1

In some embodiments, as shown in FIG. 1, the first sub-hole control layer 131 is disposed between the hole transport layer 120 and the second sub-hole control layer 132.

In some embodiments, the HOMO energy level of the first sub-hole control layer 131 is greater than the HOMO energy level of the light-emitting material layer 140 and less than the HOMO energy level of the second sub-hole control layer 132. A lowest unoccupied molecular orbital (LUMO) energy level of the first sub-hole control layer 131 is greater than a LUMO energy level of the light-emitting material layer 140, and less than a LUMO energy level of the second sub-hole control layer 132 and a LUMO energy level of the hole transport layer 120.

Specifically, as shown in FIG. 2, the HOMO energy level of the first sub-hole control layer 131 is greater than the HOMO energy level of the light-emitting material layer 140 and less than the HOMO energy level of the second sub-hole control layer 132, so that the potential barrier difference is formed between the hole transport layer 120 and the first sub-hole control layer 131, and the potential barrier difference is formed between the second sub-hole control layer 132 and the light-emitting material layer 140, forming two deep HOMO energy trap, which increases the hole injection barrier, so that a larger voltage is required to transport hole or positive charge carriers, thereby increasing the turn-on voltage of the light-emitting device or the display panel.

Specifically, the LUMO energy level of the first sub-hole control layer 131 is greater than the LUMO energy level of the light-emitting material layer 140, and less than the LUMO energy level of the second sub-hole control layer 132 and the LUMO energy level of the hole transport layer 120, which can prevent electrons from transitioning from the light-emitting material layer 140 to the hole transport layer 120, thereby preventing a decrease of luminous efficiency.

Embodiment 2

In some embodiments, as shown in FIG. 1, the first sub-hole control layer 131 is disposed between the hole transport layer 120 and the second sub-hole control layer 132.

In some embodiments, the HOMO energy level of the first sub-hole control layer 131 is greater than the HOMO energy level of the hole transport layer 120. The LUMO energy level of the first sub-hole control layer 131 is greater than the LUMO energy level of the light-emitting material layer 140, the LUMO energy level of the second sub-hole control layer 132, and the LUMO energy level of the hole transport layer 120.

Specifically, as shown in FIG. 3, the HOMO energy level of the first sub-hole control layer 131 is greater than the HOMO energy level of the hole transport layer 120, so that the potential barrier difference is formed between the first sub-hole control layer 131 and the second sub-hole control layer 132, and the potential barrier difference is formed between the second sub-hole control layer 132 and the light-emitting material layer 140, forming two deep HOMO energy trap, which increases the hole injection barrier, so that a larger voltage is required to transport hole or positive charge carriers, thereby increasing the turn-on voltage of the light-emitting device or the display panel.

Specifically, the LUMO energy level of the first sub-hole control layer 131 is greater than the LUMO energy level of the light-emitting material layer 140, the LUMO energy level of the second sub-hole control layer 132, and the LUMO energy level of the hole transport layer 120, which can prevent electrons from transitioning from the light-emitting material layer 140 to the hole transport layer 120, thereby preventing the decrease of luminous efficiency.

Embodiment 3

In some embodiments, as shown in FIG. 4, the first sub-hole control layer 131 is disposed between the second sub-hole control layer 132 and the light-emitting material layer 140.

In some embodiments, the HOMO energy level of the first sub-hole control layer 131 is greater than the HOMO energy level of the second sub-hole control layer 132 and less than the HOMO energy level of the hole transport layer 120, and the LUMO energy level of the first sub-hole control layer 131 is greater than the LUMO energy level of the light-emitting material layer 140 and less than the LUMO energy level of the hole transport layer 120.

Specifically, as shown in FIG. 5, the HOMO energy level of the first sub-hole control layer 131 is greater than the HOMO energy level of the second sub-hole control layer 132 and less than the HOMO energy level of the hole transport layer 120, so that a potential barrier difference is formed between the hole transport layer 120 and the second sub-hole control layer 132, and a potential barrier difference is formed between the first sub-hole control layer 131 and the light-emitting material layer 140, forming two deep HOMO energy trap, which increases the hole injection potential barrier, so that a larger voltage is required to transport hole or positive charge carriers, thereby increasing the turn-on voltage of the light-emitting device or the display panel.

Specifically, the LUMO energy level of the first sub-hole control layer 131 is greater than the LUMO energy level of the light-emitting material layer 140 and less than the LUMO energy level of the hole transport layer 120, which can prevent electrons from transitioning from the light-emitting material layer 140 to the hole transport layer 120, thereby preventing the decrease of luminous efficiency.

In some embodiments, the LUMO energy level of the first sub-hole control layer 131 is equal to the LUMO energy level of the second sub-hole control layer 132.

Specifically, the larger the LUMO energy difference between the first sub-hole control layer 131 and the second sub-hole control layer 132, and the hole transport layer 120, the better it can prevent electrons from crossing the LUMO energy level of the first sub-hole control layer 131 and the LUMO energy level of the second sub-hole control layer 132, and the better the effect of blocking electrons from transitioning from the light-emitting material layer 140 to the hole transport layer 120, which prevents the decrease of luminous efficiency.

Embodiment 4

In some embodiments, as shown in FIG. 4, the first sub-hole control layer 131 is disposed between the second sub-hole control layer 132 and the light-emitting material layer 140.

In some embodiments, the HOMO energy level of the first sub-hole control layer 131 is less than the HOMO energy level of the light-emitting material layer 140, and the LUMO energy level of the first sub-hole control layer 131 is greater than the LUMO energy level of the light-emitting material layer 140 and less than the LUMO energy level of the hole transport layer 120.

Specifically, as shown in FIG. 6, the HOMO energy level of the first sub-hole control layer 131 is less than the HOMO energy level of the light-emitting material layer 140, so that the potential barrier difference is formed between the hole transport layer 120 and the second sub-hole control layer 132, and the potential barrier difference is formed between the first sub-hole control layer 131 and the second sub-hole control layer 132, forming two deep HOMO energy trap, which increases the hole injection barrier, so that a larger voltage is required to transport hole or positive charge carriers, thereby increasing the turn-on voltage of the light-emitting device or the display panel.

Specifically, the LUMO energy level of the first sub-hole control layer 131 is greater than the LUMO energy level of the light-emitting material layer 140 and less than the LUMO energy level of the hole transport layer 120, which can prevent electrons from transitioning from the light-emitting material layer 140 to the hole transport layer 120, thereby preventing the decrease of luminous efficiency.

In some embodiments, the LUMO energy level of the first sub-hole control layer 131 is equal to the LUMO energy level of the second sub-hole control layer 132.

Specifically, the larger the LUMO energy difference between the first sub-hole control layer 131 and the second sub-hole control layer 132, and the hole transport layer 120, the better it can prevent electrons from crossing the LUMO energy level of the first sub-hole control layer 131 and the LUMO energy level of the second sub-hole control layer 132, and the better the effect of blocking electrons from transitioning from the light-emitting material layer 140 to the hole transport layer 120, which prevents the decrease of luminous efficiency.

Embodiment 5

A display panel provided in this embodiment is the same or similar to the display panel provided in any of the above-mentioned embodiments, differences are in that this embodiment further describes other characteristics of the display panel.

In some embodiments, the thickness of the first sub-hole control layer ranges from 3 nanometers to 10 nanometers.

Specifically, the thickness of the first sub-hole control layer 131 is greater than or equal to 3 nanometers and less than or equal to 10 nanometers. In consideration of the mass production process, if a thickness of an organic layer is too thin, it may easily cause unstable device performance. In addition, the thickness of the first sub-hole control layer 131 being greater than 3 nanometers is usually required to form an effective hole blocking potential barrier, and the smaller the energy difference, the thicker the required thickness. Therefore, in order to simultaneously meet the requirements of film stability of the first sub-hole control layer 131 and formation of the effective hole blocking potential barrier, the thickness of the first sub-hole control layer 131 is designed to be greater than or equal to 3 nanometers and less than or equal to 10 nanometers.

In some embodiments, the LUMO energy level of the second sub-hole control layer 132 is greater than the LUMO energy level of the light-emitting material layer 140 and less than the LUMO energy level of the hole transport layer 120, and the energy difference between the LUMO energy level of the second hole control layer 132 and the LUMO energy level of the light-emitting material layer 140 is greater than or equal to 0.2 eV.

Specifically, the LUMO energy level of the second sub-hole control layer 132 is greater than the LUMO energy level of the light-emitting material layer 140 and less than the LUMO energy level of the hole transport layer 120, and the energy difference between the LUMO energy level of the second sub-hole control layer 132 and the LUMO energy level of the light-emitting material layer 140 is greater than or equal to 0.2 eV, which can effectively block electrons from transitioning from the light-emitting material layer 140 to the hole transport layer 120, thereby preventing the decrease of luminous efficiency.

It should be noted that, in the display panel 100 of any of the above-mentioned embodiments, the display panel 100 may include a red light-emitting device, a green light-emitting device, and a blue light-emitting device. At least one of the red light-emitting device, the green light-emitting device, and the blue light-emitting device uses the light-emitting device of any of the above-mentioned embodiments.

Figure 7:
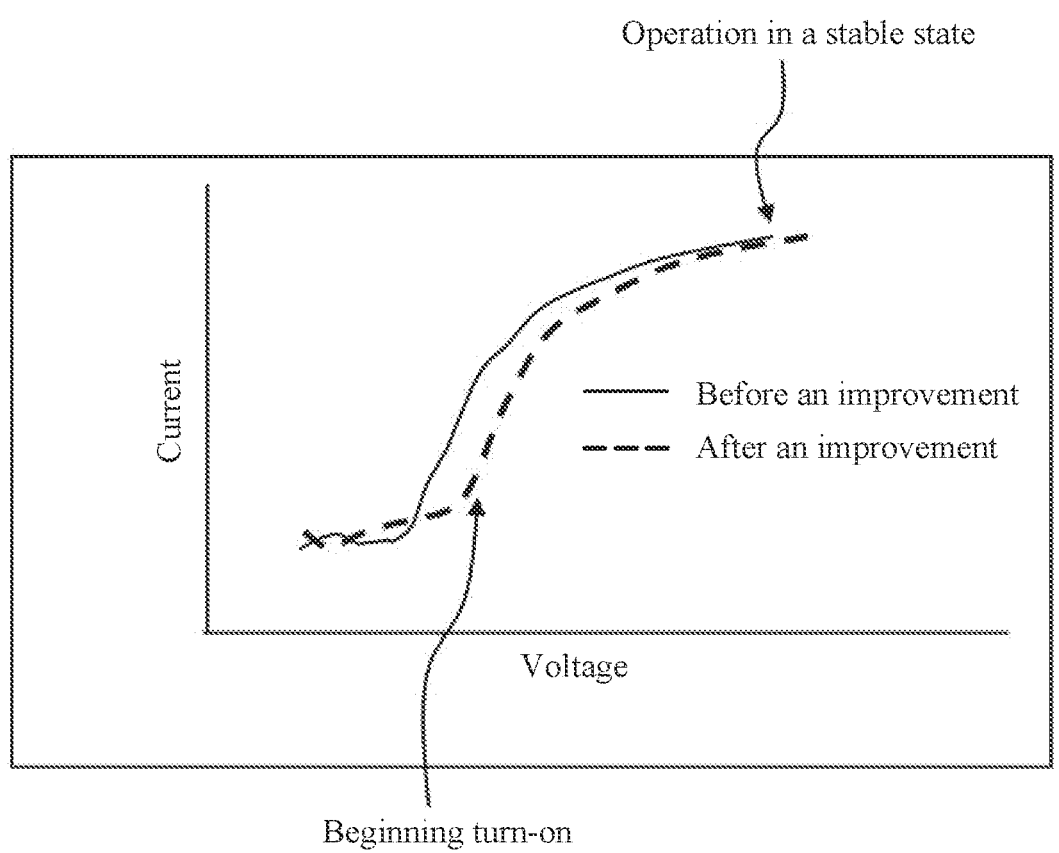
FIG. 7 is a schematic curve diagram of a measured operation voltage of a light-emitting device or display panel after an improvement according to some embodiments of the present disclosure.

Referring to FIG. 7, FIG. 7 is a schematic curve diagram of a measured operation voltage of a light-emitting device or display panel after an improvement according to some embodiments of the present disclosure. The light-emitting device or display panel before an improvement is the light-emitting device or display panel of the prior art, and the light-emitting device or display panel 100 after the improvement is the light-emitting device or display panel of any of the above-mentioned embodiments. It can be seen from FIG. 7 that the turn-on voltage of the light-emitting device or display panel 100 after the improvement increases compared to that before the improvement, and the operation voltage of the light-emitting device or display panel 100 in a stable state after the improvement is the same as that before the improvement. That is, the light emitting device or display panel 100 in the embodiments of the present disclosure has the effect of increasing the turn-on voltage and maintaining the operation voltage.

It should be noted that the light-emitting device can be disposed on the substrate 11, and the hole transport layer 120 may be composed of a hole injection sub-layer 121 and a hole transport sub-layer 122. An electron transport layer 160 is further provided between the light-emitting material layer 140 and the second electrode 170, and may be composed of an electron injection sub-layer 162 and an electron transport sub-layer 161.

It should be noted that the light-emitting material layer 140 may be composed of a host material and a light-emitting dopant. The host material may be a monomer material, a P/N hybrid material, or a deuterium substituted material. The light-emitting dopant may be a phosphorescence light-emitting material, a fluorescence light-emitting material, or a thermal activation delayed fluorescence light-emitting material. The hole injection sub-layer 121 can be made of a hole transport material doped with a P-type dopant, such as Hat-cn. The electron injection sub-layer 162 can be made of Yb, LiF, or the like. The first electrode 110 can be silver nanowires, or made of Au, ITO, or the like. The second electrode 170 can be made of Ag, Mg, Al, Ca, or a mixed alloy thereof.

The display device provided by the embodiments of the present disclosure is described in detail. In this context, specific embodiments are adopted to illustrate a principle and implementation modes of the present disclosure. The description of the above-mentioned embodiments is only used to help understand methods and a core idea of the present disclosure. At the same time, for those skilled in the art, of the idea of the present disclosure, there will be changes in specific implementation modes and a scope of the present disclosure. In conclusion, contents of the specification should not be interpreted as a limitation of the present disclosure.

What is claimed is:

1. A display panel, comprising:
a first electrode;
a hole transport layer disposed on the first electrode;
a hole control layer disposed on the hole transport layer;
a light-emitting material layer disposed on the hole control layer; and
a second electrode disposed on the light-emitting material layer;
wherein the hole control layer comprises a first sub-hole control layer and a second sub-hole control layer, a thickness of the first sub-hole control layer is less than a thickness of the second sub-hole control layer, an energy difference between a HOMO energy level of the first sub-hole control layer and a HOMO energy level of the second sub-hole control layer is greater than or equal to 0.2 eV, and
the HOMO energy level of the second sub-hole control layer is greater than a HOMO energy level of the light-emitting material layer and less than a HOMO energy level of the hole transport layer.

2. The display panel of claim 1, wherein a hole mobility of the first sub-hole control layer is less than a hole mobility of the second sub-hole control layer.

3. The display panel of claim 2, wherein a ratio of the hole mobility of the first sub-hole control layer to the hole mobility of the second sub-hole control layer is less than or equal to 0.8.

4. The display panel of claim 1, wherein the first sub-hole control layer is disposed between the hole transport layer and the second sub-hole control layer.

5. The display panel of claim 4, wherein the HOMO energy level of the first sub-hole control layer is greater than the HOMO energy level of the light-emitting material layer and less than the HOMO energy level of the second sub-hole control layer; and
a LUMO energy level of the first sub-hole control layer is greater than a LUMO energy level of the light-emitting material layer, and less than a LUMO energy level of the second sub-hole control layer and a LUMO energy level of the hole transport layer.

6. The display panel of claim 4, wherein the HOMO energy level of the first sub-hole control layer is greater than the HOMO energy level of the hole transport layer; and
a LUMO energy level of the first sub-hole control layer is greater than a LUMO energy level of the light-emitting material layer, a LUMO energy level of the second sub-hole control layer, and a LUMO energy level of the hole transport layer.

7. The display panel of claim 1, wherein the first sub-hole control layer is disposed between the second sub-hole control layer and the light-emitting material layer.

8. The display panel of claim 7, wherein the HOMO energy level of the first sub-hole control layer is greater than the HOMO energy level of the second sub-hole control layer and less than the HOMO energy level of the hole transport layer; and a LUMO energy level of the first sub-hole control layer is greater than a LUMO energy level of the light-emitting material layer and less than a LUMO energy level of the hole transport layer.

9. The display panel of claim 7, wherein the HOMO energy level of the first sub-hole control layer is less than the HOMO energy level of the light-emitting material layer; and a LUMO energy level of the first sub-hole control layer is greater than a LUMO energy level of the light-emitting material layer and less than a LUMO energy level of the hole transport layer.

10. The display panel of claim 8, wherein the LUMO energy level of the first sub-hole control layer is equal to a LUMO energy level of the second sub-hole control layer.

11. The display panel of claim 9, wherein the LUMO energy level of the first sub-hole control layer is equal to a LUMO energy level of the second sub-hole control layer.

12. The display panel of claim 1, wherein the thickness of the first sub-hole control layer ranges from 3 nanometers to 10 nanometers.

13. The display panel of claim 1, wherein a LUMO energy level of the second sub-hole control layer is greater than a LUMO energy level of the light-emitting material layer and less than a LUMO energy level of the hole transport layer; and an energy difference between the LUMO energy level of the second sub-hole control layer and the LUMO energy level of the light-emitting material layer is greater than or equal to 0.2 eV.

14. A display panel, comprising:

a first electrode;

a hole transport layer disposed on the first electrode;

a hole control layer disposed on the hole transport layer;

a light-emitting material layer disposed on the hole control layer; and a second electrode disposed on the light-emitting material layer;

wherein the hole control layer comprises a first sub-hole control layer and a second sub-hole control layer, a thickness of the first sub-hole control layer is less than a thickness of the second sub-hole control layer, an energy difference between a HOMO energy level of the first sub-hole control layer and a HOMO energy level of the second sub-hole control layer is greater than or equal to 0.2 eV, and the HOMO energy level of the second sub-hole control layer is greater than a HOMO energy level of the light-emitting material layer and less than a HOMO energy level of the hole transport layer;

a LUMO energy level of the second sub-hole control layer is greater than a LUMO energy level of the light-emitting material layer and less than a LUMO energy level of the hole transport layer, and an energy difference between the LUMO energy level of the second sub-hole control layer and the LUMO energy level of the light-emitting material layer is greater than or equal to 0.2 eV; and a hole mobility of the first sub-hole control layer is less than a hole mobility of the second sub-hole control layer.

15. The display panel of claim 14, wherein a ratio of the hole mobility of the first sub-hole control layer to the hole mobility of the second sub-hole control layer is less than or equal to 0.8.

16. The display panel of claim 14, wherein the first sub-hole control layer is disposed between the second sub-hole control layer and the light-emitting material layer.

17. The display panel of claim 16, wherein the HOMO energy level of the first sub-hole control layer is greater than the HOMO energy level of the second sub-hole control layer and less than the HOMO energy level of the hole transport layer; and a LUMO energy level of the first sub-hole control layer is greater than the LUMO energy level of the light-emitting material layer and less than the LUMO energy level of the hole transport layer.

18. The display panel of claim 16, wherein the HOMO energy level of the first sub-hole control layer is less than the HOMO energy level of the light-emitting material layer; and a LUMO energy level of the first sub-hole control layer is greater than the LUMO energy level of the light-emitting material layer and less than the LUMO energy level of the hole transport layer.

19. The display panel of claim 14, wherein a LUMO energy level of the first sub-hole control layer is equal to the LUMO energy level of the second sub-hole control layer.

20. The display panel of claim 14, wherein the thickness of the first sub-hole control layer ranges from 3 nanometers to 10 nanometers.

* * * * *